(12) United States Patent
Kumar DVJ

(10) Patent No.: US 6,911,868 B1
(45) Date of Patent: Jun. 28, 2005

(54) PHASE-LOCKED LOOP FREQUENCY SYNTHESIZER USING AUTOMATIC LOOP CONTROL AND METHOD OF OPERATION

(75) Inventor: Ravi Kumar DVJ, Bangalore (IN)

(73) Assignee: National Semiconductor Corporation, Santa Clara, CA (US)

( * ) Notice: Subject to any disclaimer, the term of this patent is extended or adjusted under 35 U.S.C. 154(b) by 44 days.

(21) Appl. No.: 09/992,500

(22) Filed: Nov. 6, 2001

(51) Int. Cl.[7] ............................................... H03L 7/00
(52) U.S. Cl. ......................... 331/16; 331/25; 331/1 A; 331/17; 327/156; 327/157
(58) Field of Search ........................... 331/16, 25, 1 A, 331/74, 17; 327/156, 157

(56) References Cited

U.S. PATENT DOCUMENTS

| | | | | |
|---|---|---|---|---|
| 5,142,247 A | * | 8/1992 | Lada et al. | ................... 331/14 |
| 5,339,050 A | * | 8/1994 | Llewellyn | ..................... 331/16 |
| 5,420,545 A | * | 5/1995 | Davis et al. | .................. 331/17 |
| 5,939,949 A | * | 8/1999 | Olgaard et al. | ............... 331/17 |

* cited by examiner

Primary Examiner—Arnold Kinkead

(57) ABSTRACT

In a phase-locked loop (PLL) frequency synthesizer, a first frequency divider divides an output signal from a voltage-controlled oscillator by a first divider value. A second frequency divider divides a reference signal by a second divider value. A charge pump increases a voltage level on a loop filter by injecting a charge pump current and decreases the voltage level on the loop filter by draining the charge pump current. A loop response control circuit adjusts the charge pump current. In particular, the first divider value may lie within one of a first plurality of ranges and/or the second divider value may lie within one of a second plurality of ranges. The charge pump current is adjusted based at least partially on which of the first plurality of ranges the first divider value lies within and/or which of the second plurality of ranges the second divider value lies within.

38 Claims, 3 Drawing Sheets

PHASE-LOCKED LOOP FREQUENCY SYNTHESIZER USING AUTOMATIC LOOP CONTROL AND METHOD OF OPERATION

CROSS REFERENCE TO RELATED APPLICATIONS

The present invention is related to those disclosed in the following U.S. Non-Provisional Patent Applications:

1) 09/993,283, filed concurrently herewith, entitled "CHARGE PUMP CIRCUIT FOR A HIGH SPEED PHASE LOCKED LOOP", now U.S. Pat. No. 6,611,161; and 2) 09/992,950, filed concurrently herewith, entitled "LOCK DETECTION CIRCUIT FOR A PHASE LOCKED LOOP CIRCUIT", now U.S. Pat. No. 6,762,631.

The above patent applications are commonly assigned to the assignee of the present invention. The disclosures of these related patent applications are hereby incorporated by reference for all purposes as if fully set forth herein.

TECHNICAL FIELD OF THE INVENTION

The present invention is generally directed to phase-locked loops (PLLs) and, more specifically, to a large scale integrated circuit that uses a phase-locked loop to generate a range of clock frequencies.

BACKGROUND OF THE INVENTION

In recent years, there have been great advancements in the speed, power, and complexity of integrated circuits (ICs), such as application specific integrated circuit (ASIC) chips, central processing unit (CPU) chips, digital signal processor (DSP) chips and the like. These advancements have made possible the development of system-on-a-chip (SOC) devices, among other things. A SOC device integrates into a single chip all (or nearly all) of the components of a complex electronic system, such as a wireless receiver (i.e., cell phone, a television receiver, and the like).

An important criterion in evaluating the performance of an electronic device is power consumption. Minimizing power consumption has long been an important design consideration in portable devices that operate on battery power. Since maximizing battery life is a critical objective in a portable device, it is essential to minimize the power consumption of ICs used in the portable device. More recently, minimizing power consumption has also become more important in electronic devices that are not portable. The increased use of a wide variety of electronic products by consumers and businesses has caused corresponding increases in the electrical utility bills of homeowners and business operators. The increased use of electronic products also is a major contributor to the increased electrical demand that has caused highly publicized power shortages in the United States, particularly California.

Generally speaking, if an electronic component operates at a slower speed, it uses less power because there are less power-consuming signal level transitions in a given time period. Also, at slower speeds, lower power supply voltages can be used because gate switching speeds are not as critical. To minimize power consumption, many complex electronic components, such as CPUs and DSPs, adaptively change the clock speed to different operating frequencies according to the requirements of the task being performed. The range of clock frequencies may be quite large.

In many electronic systems, the clock signals that drive an integrated circuit are generated by a frequency synthesizer phase-locked loop (PLL). Frequency synthesizer PLLs are well known to those skilled in the art and have been extensively written about. The dynamic performance of the frequency synthesizer PLL is dependent on several parameters, including the natural frequency ($F_n$), the damping factor ($D_F$), the crossover frequency ($F_O$) and the ratio of the comparison frequency ($F_c$) to the crossover frequency. The first three parameters depend on the voltage controlled oscillator (VCO) gain ($K_O$), the F/B (N) divider value, the charge pump current ($I_c$), and the loop filter components. The last parameter (i.e., the ratio of comparison frequency to crossover frequency) is dependent on the input divider (M) value, as well as the frequency of the input clock itself.

In a frequency synthesizer PLL in which different values of M are used as well as where input clock frequencies over a wide range could be used, there is a need for method and apparatuses that can ensure the stability of the loop over this wide operating range.

SUMMARY OF THE INVENTION

To address the above-discussed deficiencies of the prior art, it is a primary object of the present invention to provide an improved phase-locked loop (PLL) frequency synthesizer for use in large scale integrated circuits, such as system-on-a-chip (SOC) devices. According to an advantageous embodiment of the present invention, the PLL frequency synthesizer comprises: 1) a voltage controlled oscillator (VCO) that receives a frequency control voltage level stored on a loop filter and generates an output clock signal having an operating frequency, Fout, determined by the frequency control voltage level; 2) a first frequency divider for dividing the operating frequency, Fout, of the output clock signal by a first divider value, N, to produce a first divided clock signal having a frequency, Fout/N; 3) a second frequency divider for dividing a reference frequency, Fin, of an incoming reference clock signal by a second divider value, M, to produce a second divided clock signal having a frequency, Fin/M; 4) a phase-frequency detector capable of comparing the first and second divided clock signals and generating an UP control signal if the first divided clock signal is slower than the second divided clock signal and generating a DOWN control signal if the first divided clock signal is faster than the second divided clock signal. The PLL frequency synthesizer further comprises: 5) a charge pump capable of receiving the UP and DOWN control signals and increasing the frequency control voltage level on the loop filter by injecting a charge pump current, Ic, and decreasing the frequency control voltage level on the loop filter by draining the charge pump current, $I_c$; and 6) a loop response control circuit capable of adjusting a value of Ic as a function of the first divider value, N, and the second divider value, M.

According to one embodiment of the present invention, the loop response control circuit, for a given value of M, sets Ic to a minimum current level when N is in the range $1 \leq N \leq K$ and sets $I_c$ to a second current level higher than the minimum current level when N is in the range $K+1 \leq N \leq P$.

According to another embodiment of the present invention, the second current level is approximately twice the minimum current level.

According to still another embodiment of the present invention, wherein the loop response control circuit sets $I_c$ to a third current level higher than the second current level when N is in the range $P+1 \leq N \leq S$.

According to yet another embodiment of the present invention, the third current level is approximately twice the second current level.

According to a further embodiment of the present invention, the loop response control circuit, for a given value of N, sets Ic to a maximum current level when M is in the range $1 \leq M \leq J$ and sets $I_c$ to a second current level lower than the maximum current level when M is in the range $J+1 \leq N \leq Q$.

According to a still further embodiment of the present invention, the second current level is approximately one half of the maximum current level.

According to a yet further embodiment of the present invention, the loop response control circuit sets $I_c$ to a third current level lower than the second current level when M is in the range $Q+1 \leq N \leq T$.

In one embodiment of the present invention, the third current level is approximately one half of the second current level.

In another embodiment of the present invention, the loop response control circuit is further capable of adjusting a resistance, R, of a filter resistor associated with the loop filter as a function of the first divider value, N, and the second divider value, M.

In still another embodiment of the present invention, the loop response control circuit, for a given value of N, sets R to a minimum resistance value when M is in the range $1 \leq M \leq U$ and sets R to a second resistance level higher than the minimum resistance level when M is in the range $U+1 \leq M \leq V$.

In yet another embodiment of the present invention, the second resistance level is approximately twice the minimum resistance level.

In a further embodiment of the present invention, the loop response control circuit sets R to a third resistance level higher than the second resistance level when M is in the range $V+1 \leq M \leq W$.

In a still further embodiment of the present invention, the third resistance level is approximately twice the second resistance level.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 4, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged phase-locked loop frequency synthesizer.

Figure 1:
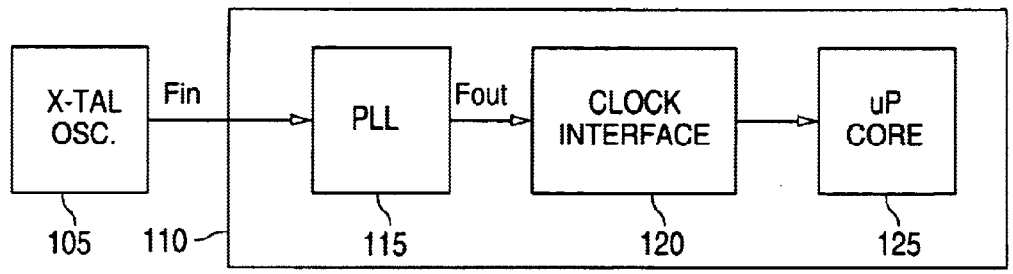
FIG. 1 illustrates an exemplary system-on-a-chip (SOC) device containing a phase-locked-loop (PLL) frequency synthesizer according to one embodiment of the present invention.

FIG. 1 illustrates exemplary system-on-a-chip (SOC) device 110 containing phase-locked-loop (PLL) 115 according to one embodiment of the present invention. SOC device 110 comprises phase-locked loop (PLL) frequency synthesizer 115, clock interface 120, and microprocessor (uP) core 125, which is capable of operating at a number of clock speeds and power supply voltages. PLL frequency synthesizer 115 receives an incoming reference frequency, Fin, from an external crystal (X-TAL) oscillator 105. PLL frequency synthesizer 115 generates from Fin an output clock frequency, Fout, that is applied to clock interface 120. The Fout clock signal can have a wide range of frequencies, depending on the task being performed by microprocessor core 125. Clock interface 120 may further divide down the Fout signal in order to produce one or more clock signals that drive microprocessor core 125.

Figure 2:
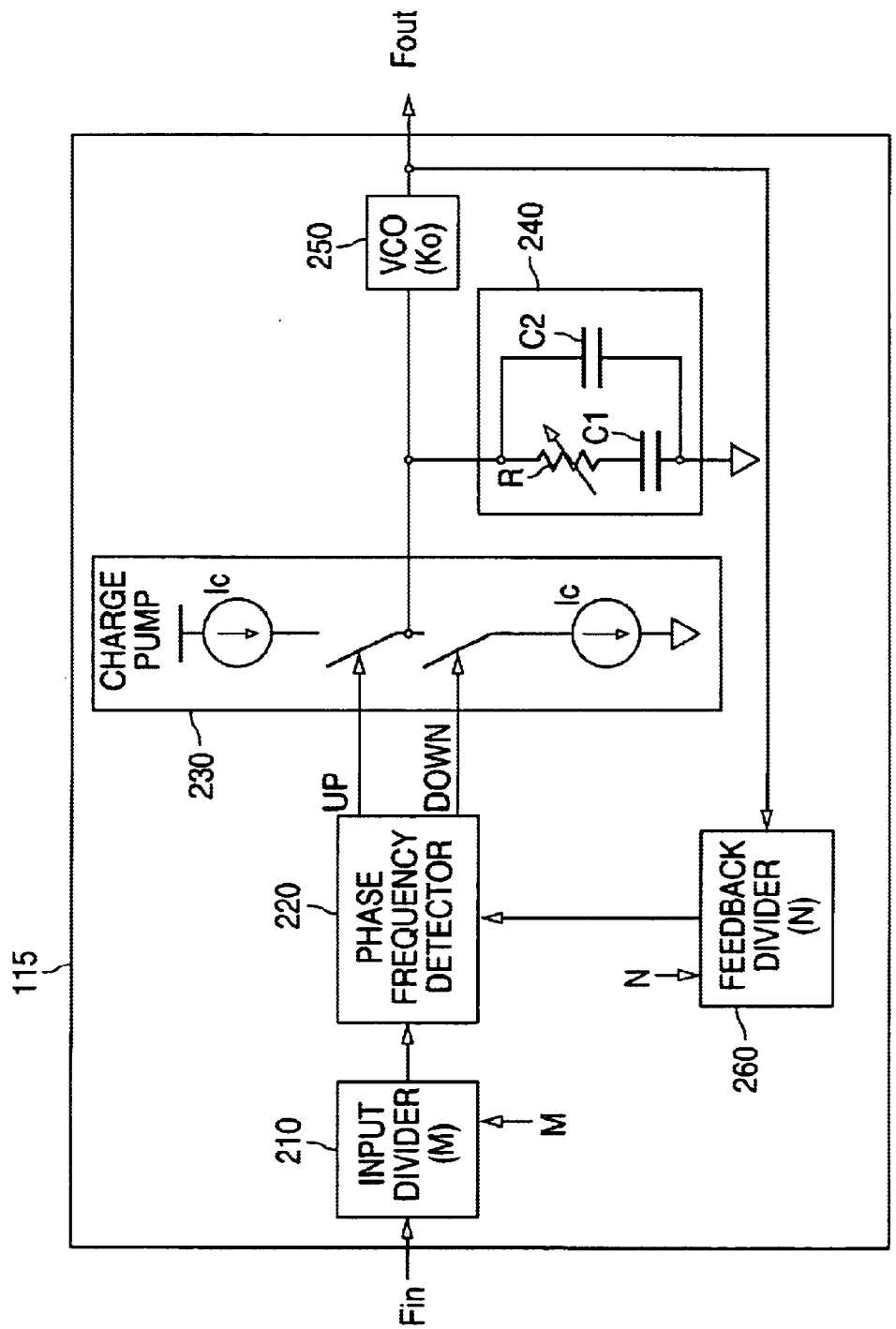
FIG. 2 depicts the exemplary phase-locked loop frequency synthesizer in FIG. 1 in greater detail according to one embodiment of the present invention.

FIG. 2 depicts exemplary phase-locked loop (PLL) frequency synthesizer 115 in FIG. 1 in greater detail according to one embodiment of the present invention. PLL frequency synthesizer 115 comprises input divider circuit 210, phase-frequency detector 220, charge pump 230, loop filter 240, voltage controlled oscillator (VCO) 250, and feedback divider circuit 260. Input divider circuit 210 divides the frequency of the Fin reference clock frequency received from crystal oscillator 105 by the value M. The divided-by-M output clock signal from input divider circuit 210 forms one input to phase-frequency detector 220. The other input to phase-frequency detector 220 is the output of feedback divider circuit 260, which divides the frequency of the PLL output clock signal, Fout, by the value N.

Phase-frequency detector 220 compares the phase and frequency of the divided-by-M output clock signal from input divider circuit 210 and the divided-by-N output clock signal from feedback divider circuit 260 and generates either an UP signal or a DOWN signal, depending on whether the divided-by-N output clock signal from feedback divider circuit 260 is faster than or slower than the divided-by-M output clock signal from input divider circuit 210. If the divided-by-N output clock signal is too slow, phase-frequency detector 220 generates an UP signal, which closes the top switch in charge pump 230 and injects the charge current $I_c$ onto the capacitors C1 and C2 in loop filter 240. If the divided-by-N output clock signal is too fast, phase-frequency detector 220 generates a DOWN signal, which closes the bottom switch in charge pump 230 and drains the charge current $I_c$ from capacitors C1 and C2 in loop filter 240.

The voltage on C2 is the input control voltage for VCO 250. As the voltage on C2 increases, the frequency of the output signal Fout of VCO 250 also increases, thereby speeding up the divided-by-N output clock signal from feedback divider 260. As the voltage on C2 decreases, the frequency of the output signal Fout of VCO 250 also decreases, thereby slowing down the divided-by-N output clock signal from feedback divider 260

By way of example, the input signal, Fin, may be equal to 10 MHz, and the input divider value M may be 4. Thus, one input to phase-frequency detector 220 receives a 2.5 MHz signal from input divider 210. Also, the output signal, Fout, may be equal to 50 MHz and the feedback divider value N may be 20. Thus, the other input to phase-frequency detector 220 receives a 2.5 MHz signal from feedback divider 260.

According to the principles of the present invention, charge pump 230 comprises a control block that automatically programs the charge pump current and the value of the variable damping resistor R in loop filter 240 as a function of both the N and M divider values. A charge pump PLL, such as the one in FIG. 2, is a negative feedback system which ensures that the phase as well as the frequency at the input of phase-frequency detector 220 is (near) zero under steady state conditions. A PLL in such a state is said to be in lock and the input and output frequencies are related by a fixed ratio which can be selected by choosing the values of the input (M) and feedback (N) frequency dividers.

A charge pump PLL is typically a second order system, and hence any change from the steady state condition results in a transient response which is typically characterized by the damping factor and the natural frequency of the system. These, in turn, are dependent on physical quantities such as the charge pump 230 current, the effective gain of VCO 250, the loop filter 240 parameters, and also on the properties of the phase-frequency detector (PFD). Events that could disturb the steady state conditions are ripple on the power supply (caused by increased processor activity), changes in the M or N divider values, or powering up the PLL. The settling behavior is also governed by the (comparison) frequency at the input of phase-frequency detector 220.

For a charge pump PLL with a charge pump current of $I_c$, VCO gain of $K_0$ (Hz/s), input divider value M, feedback divider value N, and loop filter 240 impedance $Z_i$, the following equations hold true:

$$Z_i(s) = R + 1/sC1, \text{ if } C2 \text{ is } > 10C_1 \quad \text{(Equation 1)}$$

$$F_n = 1/2\pi[[(K_0 I_c)/(CN)]^{1/2}] \quad \text{(Equation 2)}$$

$$\tau = RC \quad \text{(Equation 3)}$$

$$D_F = \tau/2[[(K_0 I_c)/(CN)]^{1/2}] \quad \text{(Equation 4)}$$

$$K = F_0 = K_0 I_c R/N \text{ Hz/s} \quad \text{(Equation 5)}$$

where K is the loop gain (or cross over frequency), $F_n$ is the natural frequency, and $D_F$ is the damping factor.

For optimum loop performance, the damping factor $D_F$ should always be in the range of 0.5 to 1.5. Also, due to the discrete time (or sampled) nature of the loop, to ensure loop stability, the switching (comparison) frequency must be around 7.5 to 10 times the loop bandwidth. From Equations 1–5, it is clear that changing the value of the feedback divider, N, changes the damping factor, $D_F$, as well as the loop gain. In order to maintain the damping factor and the loop gain in the above mentioned limits, the present invention adjusts the charge pump current to scale with N. For example, the charge pump current can be doubled after the value of N is beyond a pre-defined sub-range. More specifically, the range of N from 1 to 128 (as in a 7-bit divider) could be broken into 5 sub-ranges:

$$1 \leq N < 8 \quad 9 \leq N \leq 16 \quad 17 \leq N \leq 32 \quad 33 \leq N \leq 64 \quad 65 \leq N \leq 128$$

According to the principles of the present invention, the charge pump current, $I_c$, could be doubled once the value of N moves from the first sub-range to the second, and so on. By doing so, the damping factor as well as $F_c/K$ are constrained into a safe zone. However, this scheme does not take into consideration the fact that the comparison frequency is a function of the input divider value, M (i.e., $F_c = F_{in}/M$ and the loop parameters need to be adjusted to ensure that the above limits are maintained). The present invention automatically selects the optimum values of the loop parameters as a function of both the input divider value, M. and the feedback divider value, N.

The values of $F_c/K$ may move into non-recommended zones (i.e., outside the safe zone) for low as well as high ranges of M. This is because the crossover frequency does not track $F_c$. This can be accomplished by changing the charge pump current in the lower and the upper ranges of M and leaving the charge pump current untouched (but still a function of N) in the middle range. From Equation 5, it is possible to constrain $F_c/K$ by increasing the charge pump current in the lower ranges of M and decreasing it in the upper range. Thus, as in the case of values of N, the range of M could be divided into the following subgroups:

$$1 \leq M \leq 4 \quad 5 \leq M \leq 9 \leq M \leq 16$$

According to the principles of the present invention, the charge pump current, $I_c$, is left untouched in the midrange and as described above is varied in the other cases. However, from Equation 4, it is seen that the damping factor, $D_F$, gets effected due to the changes in the charge pump current. To compensate for this effect, the loop filter 240 resistance R is also modified.

From Equations 4 and 5, it is seen that damping factor, $D_F$, varies linearly with R but only as the square root of $I_c$. As a result of these dependencies, the current in the first range is chosen four times less in the first range and four time more in the third range as compared with the middle range. Correspondingly, R is chosen two times more in the first sub-range and two times less in the third sub-range as compared to the midrange.

Figure 3:
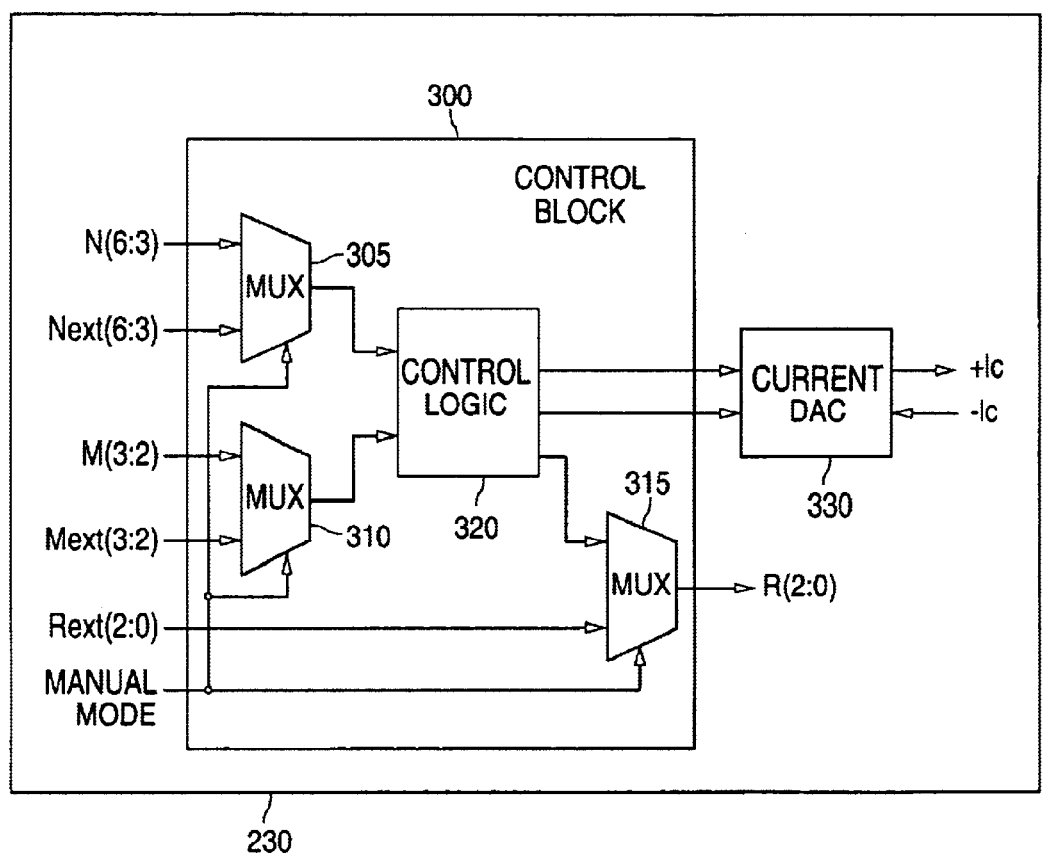
FIG. 3 illustrates selected portions of the charge current generating circuitry in the charge pump in the exemplary phase-locked loop according to one embodiment of the present invention; is

FIG. 3 illustrates selected portions of the charge current generating circuitry in charge pump 230 in exemplary phase-locked loop frequency synthesizer 115 according to one embodiment of the is present invention. Charge pump 230 comprises control block 300, and current digital-to-analog converter (DAC) 330. Control block 320 comprises multiplexer (MUX) 305, multiplexer (MUX) 310, multiplexer (MUX) 315, and control logic 320. When MANUAL MODE is not selected, control logic 320 receives the four most significant bits (MSBs), N(6:3), of the N divider and the two most significant bits (MSBs), M(3:2), of the M divider to provide adequate granularity to the values of $I_c$ and R.

Control logic 320 decodes the value of these N and M bits and generates control signal for current DAC 330, which provides the UP current, $+I_c$, and the DOWN current, $-I_c$, for charge pump 230. The $+I_c$ current injects charge onto loop filter 240 when the UP signal closes the top switch in charge pump 230. The $-I_c$ current drains charge from loop filter 240 when the DOWN signal closes the bottom switch in charge pump 230. Control logic 320 also generates control bits R(2:0) which are output through MUX 315 and adjust the resistance of the loop resistor R in loop filter 240. In an exemplary embodiment, the following values may be selected:

TABLE 1

|  | $1 \leq M \leq 4$ | | $5 \leq M \leq 8$ | | $9 \leq M \leq 16$ | |
| --- | --- | --- | --- | --- | --- | --- |
|  | $I_c$ | R | $I_c$ | R | $I_c$ | R |
| N ≤ 8 | 16 u | 4.7K | 4 u | 9.4K | 1 u | 18.8K |
| 9 ≤ N ≤ 8 | 32 u | 4.7K | 8 u | 9.4K | 2 u | 18.8K |
| 17 ≤ N ≤ 32 | 64 u | 4.7K | 16 u | 9.4K | 4 u | 18.8K |
| 33 ≤ N ≤ 64 | 128 u | 4.7K | 32 u | 9.4K | 8 u | 18.8K |
| 65 ≤ N ≤ 128 | 256 u | 4.7K | 64 u | 9.4K | 16 u | 18.8K |

Also, control block 300 is capable of manually programming the values of the loop parameters ($I_c$ and R) in a special MANUAL MODE. In this mode, externally received control bits, such as Next(6:3), Mext(3:2) and Rext(2:0), are input to control logic 320 in order to adjust the values of R(2:0) and $I_c$.

Figure 4:
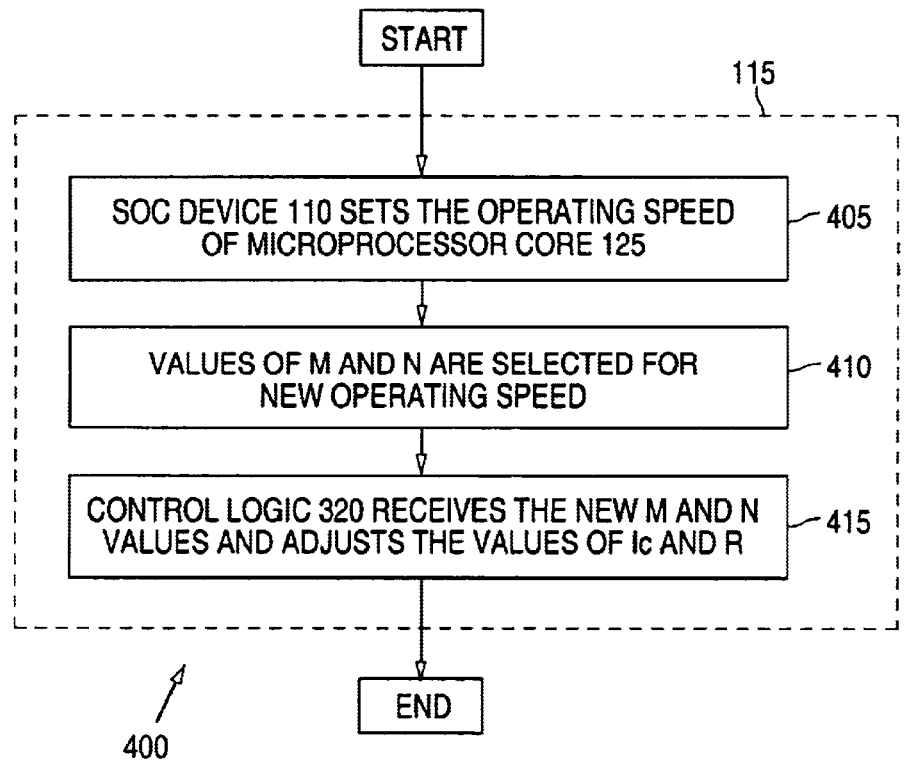
FIG. 4 is a flow diagram illustrating the operation of the exemplary phase-locked loop frequency synthesizer according to one embodiment of the present invention.

FIG. 4 depicts flow diagram 400, which illustrates the operation of exemplary phase-locked loop frequency synthesizer 115 according to one embodiment of the present invention. Initially, SOC device 110 sets the operating speed of microprocessor core 125 (process step 405) according to the task being performed. Thereafter, control logic in microprocessor core 125 or elsewhere in SOC device 110 selects the values of M and N to achieve the new operating speed (process step 410). Within PLL frequency synthesizer 115, control logic 320 receives the new M and N values and adjusts the values of $I_c$ and R (using the values in Table 1, for example) in order to stabilize the loop performance for the given values of M and N (process step 415).

The present invention provides an apparatus and related method for automatically controlling the loop dynamic response for a PLL. This method automatically chooses the optimum values of the charge pump current, $I_c$, and the loop filter resistor, R, as a function of the input divider value, M, and the feedback divider value, N. This results in a wider range of input as well as output frequencies for the PLL and also removes the burden on the user of selecting the optimum values for good behavior.

Although the present invention has been described in detail, those skilled in the art should understand that they can make various changes, substitutions and alterations herein without departing from the spirit and scope of the invention in its broadest form.

What is claimed is:

1. A phase-locked loop (PLL) frequency synthesizer comprising:
   a voltage controlled oscillator (VCO) that receives a frequency control voltage level stored on a loop filter and generates an output clock signal having an operating frequency, Fout, determined by said frequency control voltage level;
   a first frequency divider for dividing said operating frequency, Fout, of said output clock signal by a first divider value, N, to produce a first divided clock signal having a frequency, Fout/N;
   a second frequency divider for dividing a reference frequency, Fin, of an incoming reference clock signal by a second divider value, M, to produce a second divided clock signal having a frequency, Fin/M;
   a phase-frequency detector capable of comparing said first and second divided clock signals and generating an UP control signal if said first divided clock signal is slower than said second divided clock signal and generating a DOWN control signal if said first divided clock signal is faster than said second divided clock signal;
   a charge pump capable of receiving said UP and DOWN control signals and increasing said frequency control voltage level on said loop filter by injecting a charge pump current, Ic, and decreasing said frequency control voltage level on said loop filter by draining said charge pump current, Ic; and
   a loop response control circuit capable of adjusting a value of Ic as a function of said first divider value, N, and said second divider value, M, wherein said loop response control circuit is capable of adjusting the value of Ic based at least partially on at least one of: one of a first plurality of ranges in which said first divider value lies and one of a second plurality of ranges in which said second divider value lies.

2. The phase-locked loop frequency synthesizer as set forth in claim 1 wherein said loop response control circuit, for a given value of M, sets Ic to a minimum current level when N is in the range $1 \leq N \leq K$ and sets Ic to a second current level higher than said minimum current level when N is in the range $K+1 \leq N \leq P$.

3. The phase-locked loop frequency synthesizer as set forth in claim 2 wherein said second current level is approximately twice said minimum current level.

4. The phase-locked loop frequency synthesizer as set forth in claim 3 wherein said loop response control circuit sets Ic to a third current level higher than said second current level when N is in the range $P+1 \leq N \leq S$.

5. The phase-locked loop frequency synthesizer as set forth in claim 4 wherein said third current level is approximately twice said second current level.

6. The phase-locked loop frequency synthesizer as set forth in claim 1 wherein said loop response control circuit, for a given value of N, sets Ic to a maximum current level when M is in the range $1 \leq M \leq J$ and sets Ic to a second current level lower than said maximum current level when M is in the range $J+1 \leq M \leq Q$.

7. The phase-locked loop frequency synthesizer as set forth in claim 6 wherein said second current level is approximately one half of said maximum current level.

8. The phase-locked loop frequency synthesizer as set forth in claim 7 wherein said loop response control circuit sets Ic to a third current level lower than said second current level when M is in the range $Q+1 \leq M \leq T$.

9. The phase-locked loop frequency synthesizer as set forth in claim 8 wherein said third current level is approximately one half of said second current level.

10. The phase-locked loop frequency synthesizer as set forth in claim 1 wherein said loop response control circuit is further capable of adjusting a resistance, R, of a filter resistor associated with said loop filter as a function of said first divider value, N, and said second divider value, M.

11. The phase-locked loop frequency synthesizer as set forth in claim 10 wherein said loop response control circuit, for a given value of N, sets R to a minimum resistance value when M is in the range $1 \leq M \leq U$ and sets R to a second resistance level higher than said minimum resistance level when M is in the range $U+1 \leq M \leq V$.

12. The phase-locked loop frequency synthesizer as set forth in claim 11 wherein said second resistance level is approximately twice said minimum resistance level.

13. The phase-locked loop frequency synthesizer as set forth in claim 12 wherein said loop response control circuit sets R to a third resistance level higher than said second resistance level when M is in the range $V+1 \leq M \leq W$.

14. The phase-locked loop frequency synthesizer as set forth in claim 13 wherein said third resistance level is approximately twice said second resistance level.

15. An integrated circuit comprising:
a processor capable of operating at a plurality of clock speeds; and
a phase-locked loop (PLL) frequency synthesizer capable of providing at least one clock signal having a variable clock speed to said processor, said PLL frequency synthesizer comprising:
a voltage controlled oscillator (VCO) that receives a frequency control voltage level stored on a loop filter and generates an output clock signal having an operating frequency, Fout, determined by said frequency control voltage level;
a first frequency divider for dividing said operating frequency, Fout, of said output clock signal by a first divider value, N, to produce a first divided clock signal having a frequency, Fout/N;
a second frequency divider for dividing a reference frequency, Fin, of an incoming reference clock signal by a second divider value, M, to produce a second divided clock signal having a frequency, Fin/M;
a phase-frequency detector capable of comparing said first and second divided clock signals and generating an UP control signal if said first divided clock signal is slower than said second divided clock signal and generating a DOWN control signal if said first divided clock signal is faster than said second divided clock signal;
a charge pump capable of receiving said UP and DOWN control signals and increasing said frequency control voltage level on said loop filter by injecting a charge pump current, Ic, and decreasing said frequency control voltage level on said loop filter by draining said charge pump current, Ic; and
a loop response control circuit capable of adjusting a value of Ic as a function of said first divider value, N, and said second divider value, M, wherein said loop response control circuit is capable of adjusting the value of Ic based at least partially on at least one of: one of a first plurality of ranges in which said first divider value lies and one of a second plurality of ranges in which said second divider value lies.

16. The integrated circuit as set forth in claim 15 wherein said loop response control circuit, for a given value of M, sets Ic to a minimum current level when N is in the range $1 \leq N \leq K$ and sets Ic to a second current level higher than said minimum current level when N is in the range $K+1 \leq N \leq P$.

17. The integrated circuit as set forth in claim 16 wherein said second current level is approximately twice said minimum current level.

18. The integrated circuit as set forth in claim 17 wherein said loop response control circuit sets Ic to a third current level higher than said second current level when N is in the range $P+1 \leq N \leq S$.

19. The integrated circuit as set forth in claim 18 wherein said third current level is approximately twice said second current level.

20. The integrated circuit as set forth in claim 15 wherein said loop response control circuit, for a given value of N, sets Ic to a maximum current level when M is in the range $1 \leq M \leq J$ and sets Ic to a second current level lower than said maximum current level when M is in the range $J+1 \leq M \leq Q$.

21. The integrated circuit as set forth in claim 20 wherein said second current level is approximately one half of said maximum current level.

22. The integrated circuit as set forth in claim 21 wherein said loop response control circuit sets Ic to a third current level lower than said second current level when M is in the range $Q+1 \leq M \leq T$.

23. The integrated circuit as set forth in claim 22 wherein said third current level is approximately one half of said second current level.

24. The integrated circuit as set forth in claim 15 wherein said loop response control circuit is further capable of adjusting a resistance, R, of a filter resistor associated with said loop filter as a function of said first divider value, N, and said second divider value, M.

25. The integrated circuit as set forth in claim 24 wherein said loop response control circuit, for a given value of N, sets R to a minimum resistance value when M is in the range $1 \leq M \leq U$ and sets R to a second resistance level higher than said minimum resistance level when M is in the range $U+1 \leq M \leq V$.

26. The integrated circuit as set forth in claim 25 wherein said second resistance level is approximately twice said minimum resistance level.

27. The integrated circuit as set forth in claim 26 wherein said loop response control circuit sets R to a third resistance level higher than said second resistance level when M is in the range $V+1 \leq M \leq W$.

28. The integrated circuit as set forth in claim 27 wherein said third resistance level is approximately twice said second resistance level.

29. A circuit, comprising:
a first frequency divider capable of dividing a frequency of an output clock signal based on a first divider value, the output clock signal produced by a voltage controlled oscillator;
a second frequency divider capable of dividing a frequency of a reference clock signal based on a second divider value;
a charge pump capable of generating a charge pump current based on an output of the first frequency divider and an output of the second frequency divider, the charge pump current altering a frequency control voltage level used by the voltage controlled oscillator to generate the output clock signal; and
a loop response control circuit capable of adjusting the charge pump current based at least partially on at least one of: one of a first plurality of ranges in which the first divider value lies and one of a second plurality of ranges in which the second divider value lies.

30. The circuit of claim 29, wherein the first plurality of ranges comprises ranges of $1 \leq N \leq 8$, $9 \leq N \leq 16$, $17 \leq N \leq 32$, $33 \leq N \leq 64$, and $65 \leq N \leq 128$, where N represents the first divider value.

31. The circuit of claim 30, wherein the loop response control circuit is capable of doubling the charge pump current when the first divider value moves from one of the first plurality of ranges into a next higher one of the first plurality of ranges.

32. The circuit of claim 29, wherein the second plurality of ranges comprises ranges of $1 \leq M \leq 4$, $5 \leq M \leq 8$, and $9 \leq M \leq 16$, where M represents the second divider value.

33. The circuit of claim 32, wherein the loop response control circuit is capable of reducing the charge pump current by half when the second divider value moves from one of the second plurality of ranges into a next higher one of the second plurality of ranges.

34. The circuit of claim 29, further comprising a phase-frequency detector capable of comparing the output of the first frequency divider and the output of the second frequency divider and generating a control signal;

wherein the charge pump is capable of generating the charge pump current based on the control signal.

35. The circuit of claim 34, wherein the phase-frequency detector is capable of generating:

an UP control signal when the output of the first frequency divider is slower than the output of the second frequency divider; and a DOWN control signal when the output of the first frequency divider is faster than the output of the second frequency divider.

36. The circuit of claim 35, wherein the charge pump is capable of:

injecting the charge pump current into a loop filter when the control signal comprises the UP control signal; and draining the charge pump current from the loop filter when the control signal comprises the DOWN control signal, the loop filter capable of generating the frequency control voltage level.

37. An integrated circuit, comprising:

a processor; and a phase-locked loop (PLL) frequency synthesizer capable of providing at least one clock signal to the processor, the frequency synthesizer comprising:

a first frequency divider capable of dividing a frequency of an output clock signal based on a first divider value, the output clock signal produced by a voltage controlled oscillator;

a second frequency divider capable of dividing a frequency of a reference clock signal based on a second divider value;

a charge pump capable of generating a charge pump current based on an output of the first frequency divider and an output of the second frequency divider, the charge pump current altering a frequency control voltage level used by the voltage controlled oscillator to generate the output clock signal; and a loop response control circuit capable of adjusting the charge pump current based at least partially on at least one of: one of a first plurality of ranges in which the first divider value lies and one of a second plurality of ranges in which the second divider value lies.

38. A method, comprising:

dividing a frequency of an output clock signal based on a first divider value to produce a first divided signal;

dividing a frequency of a reference clock signal based on a second divider value to produce a second signal;

generating a charge pump current based on the first and second divided signals;

altering a frequency control voltage level based on the charge pump current, the frequency control voltage level used to generate the output clock signal; and adjusting the charge pump current based at least partially on at least one of: one of a first plurality of ranges in which the first divider value lies and one of a second plurality of ranges in which the second divider value lies.

* * * * *

UNITED STATES PATENT AND TRADEMARK OFFICE
CERTIFICATE OF CORRECTION

PATENT NO. : 6,911,868 B1
DATED : June 28, 2005
INVENTOR(S) : Ravi Kumar DVJ

It is certified that error appears in the above-identified patent and that said Letters Patent is hereby corrected as shown below:

<u>Column 1,</u>
Lines 10 and 13, delete "concurrently herewith" and replace with
-- November 6, 2001 --;

<u>Column 4,</u>
Line 24, delete "is";

<u>Column 6,</u>
Line 48, delete "$1 \leq M \leq 4\ 5 \leq M \leq 9 \leq M \leq 16$" and replace with -- $1 \leq M \leq 4\ 5 \leq M \leq 8\ 9 \leq M \leq 16$ --.

Signed and Sealed this

Fourth Day of April, 2006

JON W. DUDAS
*Director of the United States Patent and Trademark Office*